United States Patent [19]

Busca et al.

[11] 4,316,153
[45] Feb. 16, 1982

[54] PASSIVE MASERS HAVING OSCILLATOR AND CAVITY CONTROL LOOPS

[75] Inventors: Giovanni Busca, Neuchatel; Helmuth-Hugo Brandenberger, Sugiez, both of Switzerland

[73] Assignee: Ebauches, S.A., Switzerland

[21] Appl. No.: 119,138

[22] Filed: Feb. 5, 1980

[30] Foreign Application Priority Data

Mar. 9, 1979 [FR] France ............................. 79 06104

[51] Int. Cl.³ .............................................. H03L 7/26
[52] U.S. Cl. ........................................ 331/3; 331/94.1
[58] Field of Search ..................................... 331/3, 94

[56] References Cited

U.S. PATENT DOCUMENTS 4,122,408 10/1978 Walls ....................................... 331/3

OTHER PUBLICATIONS

Walls, "Design and Results from a Prototype Passive Hydrogen Maser Frequency Standard", Proceedings of P.T.T.I., 1976 pp. 369–380.

Walls et al., "A New Kind of Passively Operating Hydrogen Frequency Standard", Proc. 30th Annual Symposium on Frequency Control, 2–4 Jun. 1976, pp. 473–480.

Primary Examiner—Siegfried H. Grimm
Attorney, Agent, or Firm—Allegretti, Newitt, Witcoff & McAndrews

[57] ABSTRACT

The maser of the invention is particularly suitable for forming a frequency standard, by virtue of its excellent degree of frequency stability. The stimulating signal injected into a hydrogen maser cavity 10 is phase modulated at a single modulating frequency from a source 34 by a modulator 2. Nevertheless, the envelope detected signal picked off from the cavity and detected by a detector 13 includes two error signal components which respectively represent the difference between the carrier frequency of the injected signal and the frequency of the stimulated emission and the difference between the resonance frequency of the cavity and the said carrier frequency. These components are distinguished by their phases and phase shifters 42 and 44 and bring them respectively into phase with the modulating signal for detection in detectors 23 and 33 whose integrated outputs are used to control the oscillator 1 (and hence the said carrier frequency) and the cavity tuning respectively.

5 Claims, 2 Drawing Figures

PASSIVE MASERS HAVING OSCILLATOR AND CAVITY CONTROL LOOPS

BACKGROUND OF THE INVENTION

The present invention concerns a passive maser and a process for controlling a passive maser, wherein a first error signal represents the difference between the carrier frequency of an injected signal and the frequency of the stimulated emission, and is used to adjust the frequency of the injected signal, while a second error signal represents the difference between the resonance frequency of the cavity and the frequency of the injected signal, and is used to adjust the resonance frequency of the cavity. By virtue of its excellent frequency stability, such a maser is particularly suitable for forming a frequency standard.

A maser of this kind is known, in particular from the article by F. L. Wall: Proceeding of P.T.T.I. 1976, pages 369–380. A detailed description of this maser will be given hereinafter so as clearly to show the limitations thereof and to provide for full understanding of the present invention. It will suffice to mention here that the high-frequency signal introduced into the cavity is phase-modulated at two different frequencies: a relatively low frequency which is used for controlling the carrier frequency defined from the base oscillator, and a relatively high frequency which is used for controlling the resonance frequency of the cavity. A maser of this kind operates correctly only insofar as the two control loops or circuits are indeed independent.

The inventors have analyzed the extent to which the two control circuits are actually independent. They found that the cavity resonance frequency control circuit did not interfere with the injected interrogation signal frequency control circuit (also referred to as the oscillator control circuit) but that, on the other hand, the latter circuit which is sensitive to the very narrow line of the stimulated emission, caused a parasite signal to be introduced into the error signal of the circuit for controlling the maser cavity, the parasite signal completely destroying the correct error signal. The inventors have verified this fact experimentally and they have found a theoretical explanation for this phenomenon.

The object of the present invention is to prevent the error signal of the cavity control circuit being interfered with by the parasite signal of the oscillator control circuit.

BRIEF SUMMARY OF THE INVENTION

According to the invention in one aspect, there is provided a process for controlling a passive maser having a resonant cavity which contains a medium capable of stimulated emission, and which is excited by an injected phase-modulated signal, comprising the steps of producing from a signal picked off from the cavity a first error signal representing the difference between the carrier frequency of the injected signal and the frequency of the stimulated emission, using the first error signal to adjust the said carrier frequency, producing from the picked-off signal a second error signal representing the difference between the resonance frequency of the cavity and the said carrier frequency, and using the second error signal to adjust the resonance frequency, wherein the phase modulation of the injected signal is effected at a single frequency.

According to the invention in another aspect, there is provided a passive maser comprising a resonant cavity containing a medium capable of stimulated emission, means including a source of a single modulating signal for injecting into the cavity a phase-modulated signal of a carrier frequency substantially equal to the natural frequency of the stimulated emission, means responsive to a signal which is picked off from the cavity to produce a first error signal representing the difference between the said carrier frequency and the frequency of the stimulated emission, means responsive to the first error signal to adjust the said carrier frequency, means responsive to the picked-off signal to produce a second error signal representing the difference between the resonance frequency of the cavity and the said carrier frequency and means responsive to the second error signal for adjusting the resonance frequency of the cavity.

The invention makes it possible to provide a passive maser having a degree of stability which is markedly better than that of a conventional passive maser such as that described in the above-cited article.

BRIEF DESCRIPTION OF THE DRAWING

The invention will be described in more detail, by way of example, with reference to the accompanying drawing, in which.

DETAILED DESCRIPTION OF THE PREFERRED EMBODIMENT

Figure 1:
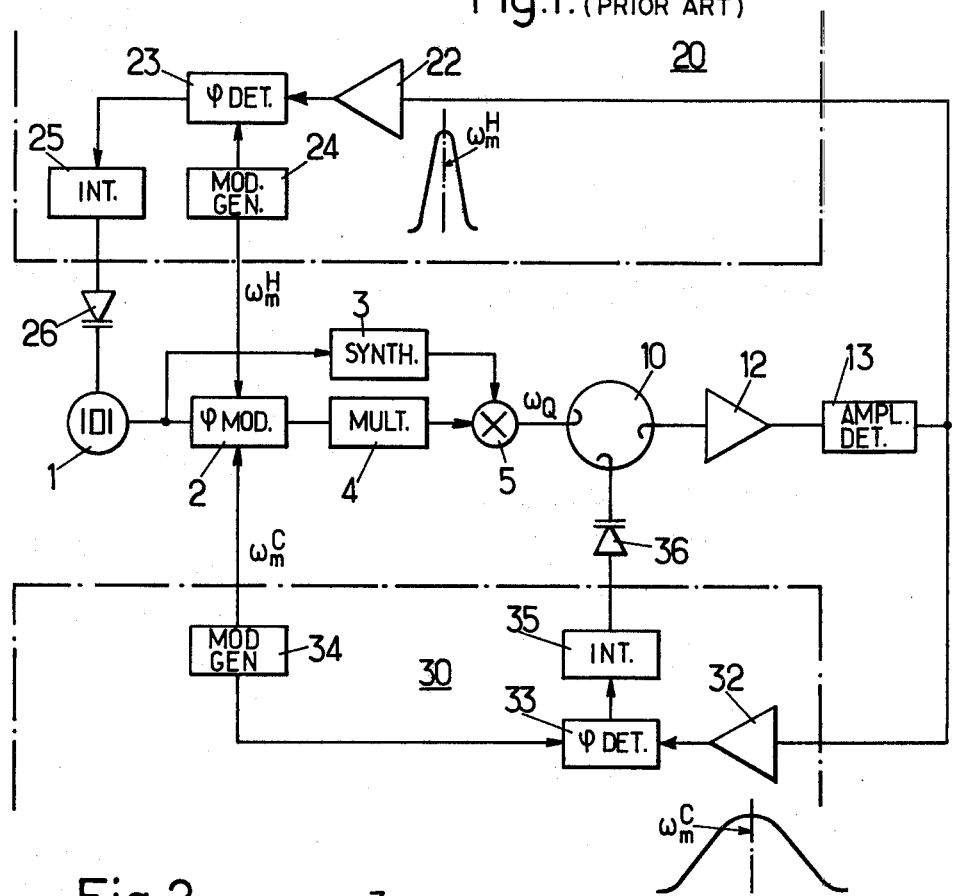
FIG. 1 is a block diagram of a known maser.

FIG. 1 is a diagrammatic view of a known maser similar to that described in the above-cited article. An oscillator 1 produces a signal at a frequency of 5 MHz. This signal is modulated in a phase modulator 2 at a first frequency $\omega_m^H$, typically 0.3 Hz, which is produced by a first generator 24, and a second frequency $\omega_m^C$, typically 12 kHz, which is produced by a second generator 34. The modulated signal is applied to a frequency multiplier 4. The 5 MHz signal is also applied to a synthesizer 3 and the outputs of the multiplier 4 and the synthesizer 3 are applied to a mixer 5 which provides a signal having a carrier frequency $\omega_Q$ which is close to 1420 MHz, which is introduced into the cavity 10.

The resonant cavity 10 is tuned to the natural frequency $\omega_H$ of the stimulated emission of the medium which it contains. In the illustrated example of a hydrogen maser, the transition which gives rise to the stimulated emission is the transition from the state $F=1$, $m_F=0$ to the state $F=0$, $m_F=0$, of a hydrogen atom which is placed in a magnetic field for separating the Zeemann sub-levels $m_F=+1$ and $m_F=-1$ from the state $F=1$. The frequency $\omega_H$ of this transition is in the region of 1420 MHz (1420.405751 . . . MHz).

The cavity 10 can be considered as a band pass filter whose coefficient $Q_c$ varies between 5000 and 50,000, depending on the volume of the cavity. For a coefficient of the order of 30,000, the cavity with the medium which it contains can be considered as a combination of such a filter with a filter having a quality factor $Q_H$ of the order of $10^9$.

An amplifier 12 receives and amplifies a signal which is detected in the cavity. This signal is rectified by an amplitude detector 13 which supplies an envelope signal which reproduces all the fluctuations in amplitude of the signal taken off in the cavity. The envelope signal is applied on the one hand to the control means 20 of the oscillator 1 and on the other hand to the control means 30 of the cavity 10.

In the control means 20 of the oscillator 1, the signal supplied by the amplitude detector 13 is applied to a filter 22 which essentially passes the frequencies which are close to the first modulation frequency $\omega_m^H$, in this case 0.3 Hz, of the generator 24. The filtered signal is applied to a phase detector 23 whose other input is connected to the generator 24 so as to provide for synchronous detection which makes it possible to detect if the carrier frequency $\omega_Q$ of the cavity interrogation signal is indeed centred on the natural frequency $\omega_H$ of the stimulated emission. Any frequency shift results in an error signal at the output of the phase detector 23. The error signal is applied to an integrator 25 and used for controlling a variable capacitor 26 which is coupled to the oscillator 1, whereby its frequency may be slightly varied for correction thereof.

In the control means 30 of the cavity 10, the envelope signal is received by a filter 32 which essentially passes the components which are close to the second modulation frequency $\omega_m^C$, in the present case this being about 12 kHz. The filtered signal is applied to a phase detector 33 for synchronous detection, the other input of the phase detector being connected to the second generator 34 for receiving the second modulation frequency therefrom. The error signal produced by the phase detector 33 indicates a shift in the resonance frequency of the cavity 10 with respect to the carrier frequency $\omega_Q$. The error signal which is subjected to processing by the integrator 35 is used for controlling a variable capacitor 36 which is coupled to the cavity 10, whereby the resonance frequency $\omega_C$ thereof may be slightly varied for correction purposes.

In summary, in a maser of this kind, the phase modulated signal at frequencies $\omega_m^H$ (0.3 Hz) and $\omega_m^C$ (12 kHz) respectively interrogates the line of the stimulated emission from the hydrogen and the resonance curve of the cavity in order respectively to provide for control of the oscillator by the stimulated emission and control of the resonance frequency of the cavity by the carrier frequency $\omega_Q$ derived from the oscillator. The adverse effects of "cavity pulling" are virtually eliminated in this maser.

A maser of this kind represents the known state of the art which the inventors took as their basic starting point. Control of this maser is satisfactory to the extent that the two loops are indeed independent. The inventors have observed that in actual fact this desired independence was not the case. The inventors discovered that the control circuit of the cavity did not cause interference with the control circuit of the oscillator, but that, on the contrary, the latter circuit which is sensitive to the very narrow stimulated emission line introduced a very powerful parasitic signal into the error signal of the second circuit, the parasite signal completely destroying the correct error signal.

The inventors carried out the following experiment in order to provide proof in support of this conclusion:

(A) A single modulation action is effected at a time, and it is verified that one and other of the two control circuits operate correctly, separately. In particular, it was found that the difference $(\omega_C - \omega_Q)$ between the resonance frequency of the cavity $\omega_C$ and the carrier frequency $\omega_Q$ produced from the oscillator could be kept at a relative value of less than $10^{-9}$ in the long-term region (of the order of $10^4$ seconds).

(B) It is verified that the circuit for controlling the oscillator, with respect to the stimulated emission line or line H, also operates correctly in the presence of the modulation action in respect of the second control circuit, which circuit however remains open.

(C) The two circuits are both closed and it is found that tuning of the cavity moves away from the line H by virtue of undesirable effects which occur in the cavity control circuit.

It was verified that the circuit for controlling the oscillator on the line H produced a powerful amplitude-modulated (AM) parasite signal at the frequency of modulation $\omega_m^C$ of the circuit for controlling the cavity, even when the cavity was tuned. In addition, this signal is phase-modulated at the modulation frequency $\omega_m^H$ used for interrogating the line H.

By suppressing the interrogation modulation in respect of the line H and moving the carrier frequency $\omega_Q$ away from the frequency of the line H, it was found that the amplitude-modulated parasite signal was produced by a high-frequency signal interacting with the line H. The phase of the amplitude-modulated signal suffers an abrupt change of 180° when the carrier frequency $\omega_Q$ is allowed to pass across the line H.

The inventors have proposed a simplified theoretical interpretation of their observations.

If a signal is presented to the entrance of the empty cavity, such signal essentially comprising a carrier $\omega_Q$ and two side bands which are 180° out of phase and which are symmetrical with respect to the frequencies $\omega_Q + \omega_m$ and $\omega_Q - \omega_m$, $\omega_Q$ being very close to the resonance frequency of the cavity $\omega_C$, the cavity control circuit produces an error signal of the following form:

$$E = A_o \epsilon + D_o S \tag{1}$$

in which:

$$\epsilon = (A_+ - A_-) \cos\omega_m t + (D_+ + D_-) \sin\omega_m t \tag{2}$$

$$S = (D_+ - D_-) \cos\omega_m t - (A_+ + A_-) \sin\omega_m t \tag{3}$$

In these equations, the expressions $A_o$, $A_+$ $A_-$ represent absorption of the cavity at different frequencies:

$$A_+ = A(\omega_Q + \omega_m)$$

$$A_o = A(\omega_Q)$$

$$A_- = A(\omega_Q - \omega_m)$$

absorption in dependence on frequency corresponding to the following equation:

$$A(\omega) = \frac{r^2}{r^2 + (\omega - \omega_C)^2} \tag{4}$$

in which r is the half-width of the resonance curve.

The expressions $D_o$, $D_+$, $D_-$ represent the dispersion of the cavity at the respective frequencies $\omega_Q$, $\omega_Q + \omega_m$, $\omega_Q - \omega_m$, dispersion corresponding to the following equation:

$$D(\omega) = \frac{r(\omega - \omega_C)}{r^2 + (\omega - \omega_C)^2} \tag{5}$$

If hydrogen atoms which are capable of stimulated emission are introduced into the cavity, the expressions $A_o$ and $D_o$ in equation (1) must be modified in accordance with the following substitutions:

$$A_o \rightarrow A_o + A_H \quad (6)$$

$$D_o \rightarrow D_o + D_H \quad (7)$$

in which $A_H$ represents the gain due to the presence of the hydrogen atoms, and $D_H$ represents the associated dispersion. Substitution equation (6) simply implies a change in the importance of the term $(A_o+A_H)\epsilon$ of the cavity error signal.

On the contrary, the effect of substitution (7) is that in term $(D_o+D_H) \cdot S$, dispersion $D_H$ is completely dominant. Indeed the ratio $D_H/D_o$ is as follows:

$$\frac{D_H}{D_o} = \frac{Q_H}{Q_C}\left(\frac{\omega_Q - \omega_H}{\omega_Q - \omega_C}\right) \quad (8)$$

The result of this is that $D_H$ is several orders of magnitude higher than $D_o$. Typically, $D_H/D_o = 1.10^{+4}$ for $$\omega_Q - \omega_H = 0.3 \cdot 2\pi \text{ RAD/sec and}$$

$$\omega_Q - \omega_C = 1 \cdot 2\pi \text{ RAD/sec.}$$

The effect of modulation at low frequency $\omega_m^H$ on the carrier may be considered as a frequency fluctuation which causes the carrier periodically to pass across the line H; the result of this is that $D_H$ periodically changes in sign at the same rhythm, which produces periodic switching of the phase of the AM parasite signal.

Theoretically, after synchronous detection and integration, the parasite signal should therefore be cancelled and should make it possible to regain the small correct error signal; however, as the parasite signal is several orders of magnitude greater than the correct signal, this would impose requirements in regard to precise symmetry in respect of the synchronous detector and the integrator, which are totally impossible to achieve.

From this the inventors therefore concluded that the two simultaneous circuits cannot be made sufficiently independent and that the control arrangement does not operate correctly.

The present invention makes it possible to overcome this disadvantage. The invention is based on the discovery by the inventors that it is possible to use only a single modulation frequency as the envelope signal which is produced from the signal detected in the cavity (and which reproduces all the fluctuations in amplitude of the latter) in fact alone contains all the information required for producing the error signals which permit control of the frequency of the interrogation signal and the resonance frequency. The envelope signal contains two components which are amplitude modulated at the frequency of the phase modulation, namely a component which represents the difference between the carrier frequency of the interrogation signal and the frequency of the stimulated emission, and a component which represents the difference between the resonance frequency of the cavity and the carrier frequency. These two components are out-of-phase, with respect to the modulation signal, by an angle $\theta_H$ in respect of the control circuit of the oscillator and an angle $\theta_c$ in respect of the control circuit of the cavity.

More precisely, the signal E which is amplitude modulated at the modulation frequency $\omega_m$ is defined by the following equation:

$$E = (A_o+A_H)\epsilon + (D_o+D_H)S \quad (9)$$

in which $\epsilon$ and $S$ are given by equations (2) and (3) above and depend exclusively on the parameters of the cavity. If the carrier frequency is shifted with respect to the frequency of the stimulated emission, the term $D_H S$ represents the dominant component of the error signal which can therefore be used in the oscillator control circuit for centering the carrier frequency on that of the stimulated emission. The term $D_H$ is then zero. The phase shift $\theta_H$ of said component with respect to the modulation signal is such that:

$$tg\theta_H = r/\omega_m \quad (10)$$

On the other hand, as $D_H$ tends toward zero, the signal E tends towards the value:

$$(A_o+A_H)\epsilon + D_o S \quad (11)$$

which represents the signal representing pure error in respect of the cavity.

This component can therefore be used in the cavity control circuit for centering the resonance frequency on the carrier frequency. The phase displacement $\theta_c$ of the above-mentioned component with respect to the modulation signal is such that:

$$tg\theta_c = 2\omega_m r/(\omega_m^2 - r^2) \quad (12)$$

This discovery is put to use in the maser according to the invention, which thus uses a single modulation for the two control circuits. This makes it possible not only to avoid the parasitic effect of the oscillator control circuit on the cavity control circuit, but also substantially to improve the quality of the control action.

Figure 2:
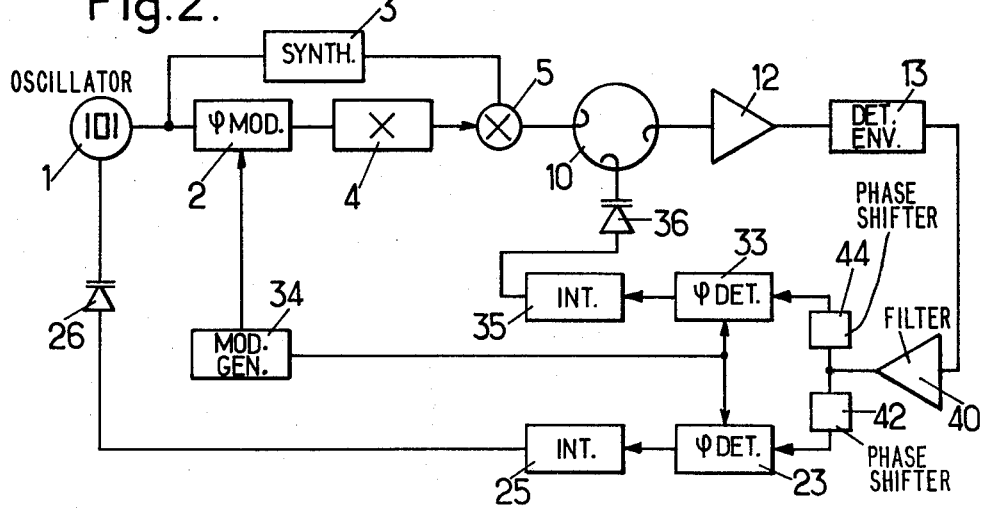
FIG. 2 is a block diagram of an illustrative maser embodying the invention.

Reference will now be made to FIG. 2 which is a diagrammatic view of an illustrative embodiment of a maser according to the invention. The maser comprises many components which are similar to those of the maser shown in FIG. 1, and such components are therefore denoted by the same reference numerals.

The phase modulator 2 is connected solely to the modulation generator 34 which operates at a frequency of 12 kHz and whose output signal is applied both to the phase detector 23 of the oscillator control circuit and to the phase detector 33 of the cavity control circuit.

The envelope signal produced by the amplitude detector 13 is applied to a single filter 40 which passes essentially the frequencies which are close to the modulation frequency (12 kHz) of the generator 34. The filtered signal is applied on the one hand to the phase detector 23, by way of a phase-shifting circuit 42, and, on the other hand, to the phase detector 33 by way of a phase-shifting circuit 44. The phase shift or difference introduced by the circuit 42 is so adjusted as to bring the phase of the component for controlling the oscillator back to that of the reference signal applied to the detector 23 by the generator 34. Similarly, the phase shift introduced by the circuit 44 is so adjusted as to bring the phase of the component for controlling the cavity back to that of the reference signal supplied by the generator 34.

Under these conditions, the phase detector 23 produces an error signal which represents the difference between the carrier frequency of the cavity interrogation signal and the frequency of the stimulated emission. This error signal is applied to the integrator 25 whose output signal adjusts the frequency of the oscillator 1 by way of the variable capacitor 26 so as to correct the frequency difference.

In the same way, the detector 33 produces an error signal which represents the difference between the carrier frequency of the interrogation signal and the resonance frequency of the cavity. This error signal is applied to the integrator 35 whose output signal adjusts the resonance frequency of the cavity by way of the variable capacitor 36 so as to correct the frequency difference.

The quality of the oscillator and cavity control action obviously depends on the precision with which the phase-shifting circuits 42 and 44 produce a phase shift or difference in the components of the envelope signal produced by the amplitude detector 13 to bring them respectively into phase with the reference signal produced by the generator 34. In fact, the above-specified formulae express the theoretical values in respect of the phase shifts for the two components of the envelope signal, but they do not take into account the phase shifts or differences due to the transmission lines and to the electronic equipment. It is therefore necessary to effect adjustment in respect of the phase shifts, and this adjustment can be performed as now described.

In order to provide for adjustment of the phase shift of the oscillator control circuit, the modulation frequency can be shifted to a value of less than 1 Hz, and the circuit 42 can be so adjusted as to produce a maximum error signal at the output of the phase detector 23. As regards adjustment of the phase shift of the cavity control circuit, it is possible either to eliminate the stimulated emission by stopping the supply of hydrogen to the cavity or by reducing its static magnetic field, or to increase the level of the injected power and adjust the circuit 44 so as to produce a maximum error signal at the output of the phase detector 33.

As already stated above, by virtue of using a single modulation action in respect of the two control circuits, the present invention makes it possible to avoid the parasitic effect of the oscillator control circuit on the cavity control circuit. In addition, using a relatively high frequency (12 kHz) for the circuit for controlling the frequency of the cavity interrogation signal makes it possible to operate outside the pass band of the line H of a filter and therefore very substantially to reduce flicker noise. Using a high frequency also makes it possible to provide for more rapid control of the oscillator than in the case of the maser shown in FIG. 1. Finally, control of the oscillator may be effected over a substantially wider region, as the error signal is determined by a dispersion function whose fall is substantially slower than for an absorption function, as is the case with the maser shown in FIG. 1.

While a preferred embodiment of the invention has been shown and described in some detail, it will be understood that the description and the accompanying drawing are offered merely by way of example and that various changes and modifications may be made without departing from the spirit of the invention as particularly defined in the following claims.

What is claimed is:

1. A process for controlling a passive maser having a resonant cavity which contains a medium capable of stimulated emission, and which is excited by an injected phase-modulated signal, comprising the steps of producing from a signal picked off from the cavity a first error signal representing the difference between the carrier frequency of the injected signal and the frequency of the stimulated emission, using the first error signal to adjust the said carrier frequency, producing from the picked-off signal a second error signal representing the difference between the resonance frequency of the cavity and the said carrier frequency, and using the second error signal to adjust the resonance frequency of the cavity, wherein the phase modulation of the injected signal is effected at a single frequency.

2. A process according to claim 1, wherein the first and second error signals are extracted from the signal picked off from the cavity by phase discrimination.

3. A passive maser comprising a resonant cavity containing a medium capable of stimulated emission, means including a source of a carrier frequency, a source of a single modulating signal for modulating the carrier frequency and injecting into the cavity a phase-modulated signal of the carrier frequency substantially equal to the natural frequency of the stimulated emission, means responsive to a signal which is picked off from the cavity to produce a first error signal representing the difference between the said carrier frequency and the frequency of the stimulated emission, means responsive to the first error signal to adjust the said carrier frequency, means responsive to the picked-off signal to produce a second error signal representing the difference between the resonance frequency of the cavity and the said carrier frequency, and means responsive to the second error signal for adjusting the resonance frequency of the cavity.

4. A passive maser according to claim 3, wherein the means which produce the first and second error signals extract these signals from the signal picked off from the cavity by phase discrimination.

5. A passive maser according to claim 4, wherein a detector produces from the signal picked off from the cavity an envelope signal which comprises the two components which are amplitude-modulated at the frequency of the phase modulation with different phases, namely a first component representing the difference between the said carrier frequency and the frequency of the stimulated emission and a second component representing the difference between the resonance frequency of the cavity and the said carrier frequency; and wherein the means for producing the first error signal comprise a first phase-shifting circuit connected to receive the envelope signal and adapted to bring the phase of the said first component substantially to that of the signal produced by the modulation signal source, and a first phase detector circuit whose inputs are connected to the first phase-shifting circuit and to the modulation signal source, and the means producing the second error signal comprise a second phase-shifting circuit connected to receive the envelope signal and adapted to bring the phase of the said second component substantially to that of the signal produced by the modulation signal source, and a second phase detector circuit whose inputs are connected to the second phase-shifting circuit and to the modulation signal source.

* * * * *